United States Patent [19]

Horiuchi

[11] Patent Number: 5,543,359

[45] Date of Patent: Aug. 6, 1996

[54] METHOD OF FORMING A TITANIUM SILICIDE FILM INVOLVED IN A SEMICONDUCTOR DEVICE

[75] Inventor: Tadahiko Horiuchi, Tokyo, Japan

[73] Assignee: NEC Corporation, Tokyo, Japan

[21] Appl. No.: 361,532

[22] Filed: Dec. 22, 1994

[30] Foreign Application Priority Data

Dec. 22, 1993 [JP] Japan .................................. 5-323578

[51] Int. Cl.$^6$ .................................................. H01C 21/44
[52] U.S. Cl. .......................... 437/195; 437/200; 437/240
[58] Field of Search .................................... 437/195, 240, 437/200

[56] References Cited

FOREIGN PATENT DOCUMENTS 0155699  9/1985  European Pat. Off. .

2126418  3/1984  United Kingdom .

Primary Examiner—R. Bruce Breneman
Assistant Examiner—Matthew Whipple
Attorney, Agent, or Firm—Young & Thompson

[57] ABSTRACT

A method of forming a silicate glass film including phosphorus on a titanium silicide film is provided wherein a silicate glass film including phosphorus is formed on a titanium silicide film and thereafter the silicate glass film is subjected to a heat treatment at a temperature in the range from 650° C. to 950° C. for a time in the range from 20 to 70 seconds to cause a fineness reaction of the silicate glass film and suppress a cohesion reaction of the titanium silicide film.

31 Claims, 2 Drawing Sheets 5,543,359

METHOD OF FORMING A TITANIUM SILICIDE FILM INVOLVED IN A SEMICONDUCTOR DEVICE

BACKGROUND OF THE INVENTION

The invention relates to a method of forming a titanium silicide film serving as an electrode or an an interconnection involved in a semiconductor device.

In the prior art, polysilicon films doped with phosphorus have often been used as electrodes and interconnections in fabrication processes of semiconductor integrated circuits including MOS field effect transistors. A resistance of the gate electrode or the interconnection comprising the polysilicon film doped with phosphorus provides a limitation to an improvement in a high speed performance of the MOS field effect transistor.

To solve the above problem and permit a further improvement in a high speed performance of the MOS field effect transistor, in place of the phosphorus doped polysilicon film, a polycide structure comprising a polysilicon and a high melting point metal silicide has been on the use. Particularly, a titanium silicide film has a smaller resistivity in various high melting point metal silicide films. A titanium silicide film serving as the gate electrode is suitable in a self-alignment process for reductions of resistances of source and drain diffusion regions in the MOS field effect transistor. For the above reasons, the titanium silicide film is attractive as an electrode and an interconnection.

In the formation of the interconnection comprising the titanium silicide film, an inter-layer insulator comprising a phospho-silicate glass film or a boron phospho-silicate glass film is deposited on a titanium silicide film by a vapor phase growth for subsequent heat treatment at a temperature in the range of from 750° C. to 900° C. of the inter-layer insulator to cause a reflow of the phospho-silicate glass film or the boron phospho-silicate glass film. The heat treatment is carried out by annealing for at least a time in the range of from 5 to 10 minutes.

The heat treatment at the temperature of 750° C. to 900° C. for the time of 5 to 10 minutes may cause a cohesion reaction of the titanium silicide in the electrode or the interconnection layer. The cohesion reaction of the titanium silicide may cause a disconnection of the titanium silicide layer constituting the electrode or the interconnection.

To prevent the disconnection of the titanium silicide layer constituting the electrode or the interconnection, the titanium layer is required to have a thickness of at least 100 nanometers. Notwithstanding, a reduction of the thickness of the titanium layer constituting the electrode or the interconnection is necessarily required for a further scaling down of the MOS field effect transistors in order to achieve a further improvement in the density of the integration of the semiconductor integrated circuits.

In the above-viewpoints, it is required to develop a novel method of forming a titanium silicide film underlying an insulation film of silicate glass including phosphorus with suppression of any cohesion reaction.

SUMMARY OF THE INVENTION

Accordingly, it is an object of the present invention to provide a novel method of forming a titanium silicide film underlying a silicate glass film including phosphorus involved in semiconductor integrated circuits to enable a suppression of a cohesion reaction of titanium silicide.

It is a further object of the present invention to provide a novel method of forming a titanium silicide film underlying a silicate glass film including phosphorus to be free from any disconnection of a thin titanium silicide layer constituting an electrode or an interconnection involved in semiconductor integrated circuits.

The above and other objects, features and advantages of the present invention will be apparent from the following descriptions.

The invention provides a method of forming a titanium silicide layer underlying a silicate glass film including phosphorus. A titanium silicide film having a thickness less than 80 nanometers is formed, after which a silicate glass film including phosphorus is formed on the titanium silicide layer. Subsequently, the silicate glass film is subjected to a heat treatment at a temperature 650° to 950° C. for a short time in the range of from 20 to 70 seconds to cause a fineness of the silicate glass with phosphorus but to cause no reflow of the silicate glass.

BRIEF DESCRIPTIONS OF THE DRAWINGS

Preferred embodiments of the present invention will hereinafter fully be described in detail with reference to the accompanying drawings.

DESCRIPTIONS OF THE INVENTION

The present invention provides a novel method of forming a titanium silicide film underlying a silicate glass film including phosphorus. A titanium silicide film having a thickness of 80 nanometers is formed on an insulation film over a semiconductor substrate. A silicate glass film including phosphorus is formed on the titanium silicide film. Subsequently, the silicate glass film is subjected to a heat treatment at a temperature in the range of from 650° C. to 950° C. for such a short tome of 20 to 70 seconds as to cause only a fineness reaction of silicate glass with phosphorus but no reflow of the silicate glass with phosphorus is caused so as to suppress any cohesion reaction of the titanium silicide film. The present invention utilizes a time difference between the cohesion reaction of the titanium silicide film and the fineness reaction of the silicate glass film with phosphorus. Since the fineness reaction of the silicate glass film with phosphorus is caused before the cohesion reaction of the titanium silicide film is caused, the heat treatment of the silicate glass film with phosphorus is continued to cause the fineness reaction of the silicate glass film with phosphorus until before the cohesion reaction of the titanium silicide film is caused.

Figure 1:
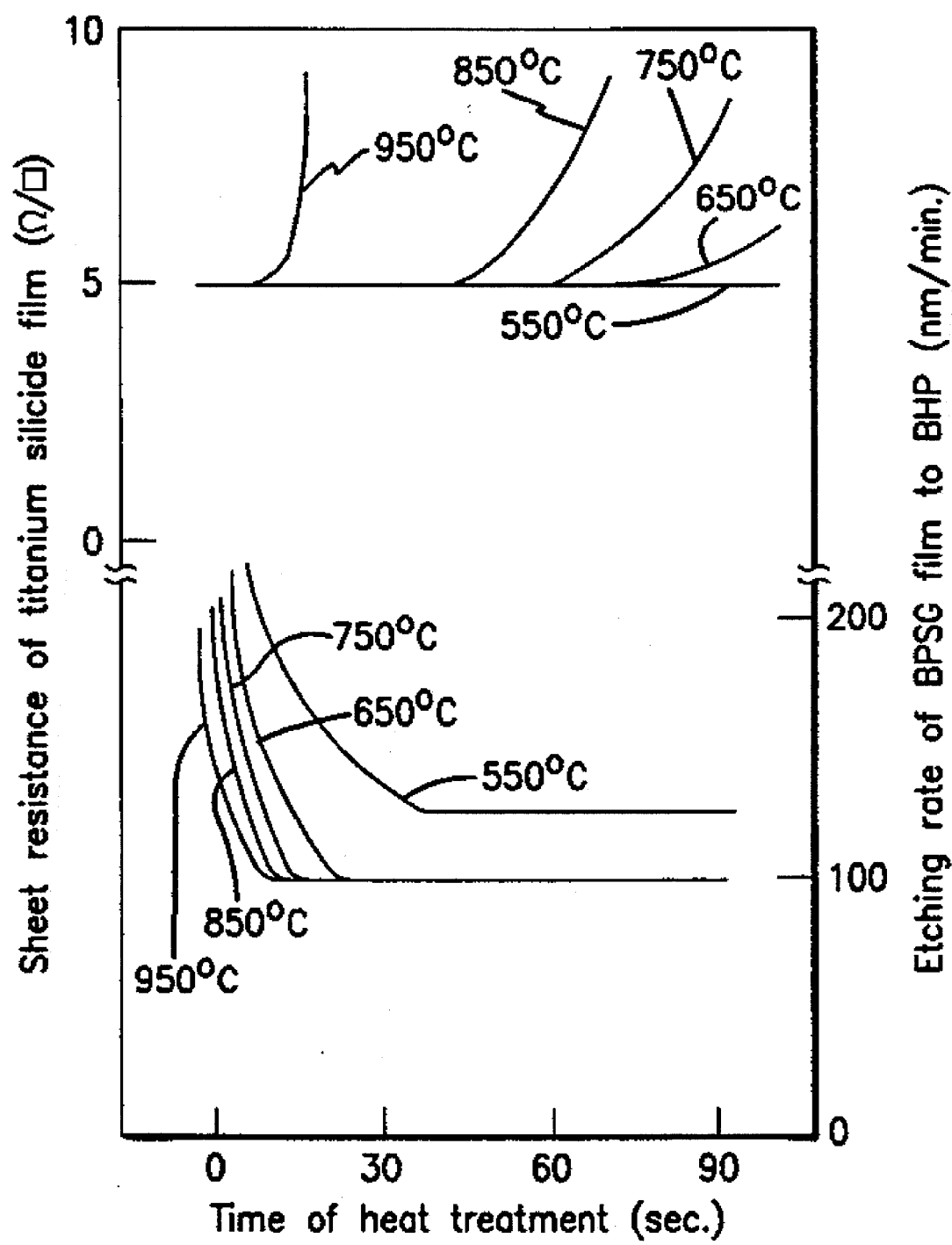
FIG. 1 is a diagram illustrative of a sheet resistance of a titanium silicide layer and an etching rate of a boron phosphoric silicide glass film to a buffered fluorine acid versus a time of a heat treatment.

FIG. 1 is illustrative of a degree of a fineness reaction of a boron phosphoric silicate glass film verses a heat treatment and a degree of a cohesion reaction of a titanium silicide film versus the heat treatment. The degree of the fineness of the boron phosphoric silicate glass film may be represented by the etching rate of the boron phosphoric silicate glass film to the buffered fluorine acid. A large value of the etching rate represents a small degree of the fineness of the boron phosphoric silicate glass and a small value of the etching rate represents a large degree of the fineness of the boron phosphoric silicate glass. A degree of the cohesion reaction of the titanium silicide film may be represented by an increase of the sheet resistance of the titanium silicide film. As the cohesion reaction is progressed, the titanium silicide film may approaches a disconnection state thereby the sheet resistance of the titanium silicide film is increased.

A boron phosphoric silicate glass film having a thickness of 0.6 micrometers is formed on a titanium silicide film having a thickness of 40 nanometers and a pattern width of 0.25 micrometers for subsequent heat treatment at a temperature in the range of from 550° C. to 950° C. to measure the degrees of the fineness reaction of the boron phosphorus silicate glass and the degree of the cohesion reaction of the titanium silicide film. From FIG. 1 it is understood that a heat treatment at a temperature of 850° C. for 20 seconds or more may cause the fineness reaction of the boron phosphoric silicate glass film and a heat treatment at the temperature of 850° C. for 50 seconds or less results in no cohesion reaction of the titanium silicide film. Namely, the heat treatment of 850° C. in the range of time from 20 seconds to 50 seconds is preferable to cause the fineness reaction of the boron phosphoric silicate glass film but to suppress the cohesion reaction of the titanium siliciade film. A heat treatment of 950° C. in the range of time from 10 seconds to 15 seconds is preferable to cause the fineness reaction and to suppress the cohesion reaction. A heat treatment of 650° C. in the range of time from 20 seconds to 70 seconds is preferable. Consequently, in the heat treatment a temperature in the range from 650° C. to 950° C. and a time thereof are available to cause the fineness reaction of the boron phosphoric silicate glass film but to suppress the cohesion reaction of the titanium siliciade film having a small thickness of 40 nanometers.

The above novel heat treatment condition may permit a thickness of a titanium silicide film to be reduced from 100 nanometers to 20 nanometers or less. This may permit a shallow depth of the junction of the MOS field effect transistor using the titanium silicide film.

Figure 2A:
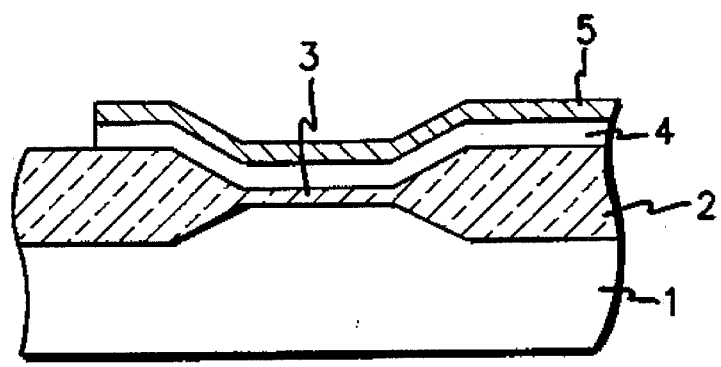
FIGS. 2A to 2C are fragmentary cross sectional elevation views illustrative of sequential processes involved in a method of forming a titanium silicide layer underlying a boron phosphoric silicate glass film according to the present invention.

A preferred embodiment according to the present invention will be described with reference to FIGS. 2A to 2C in which a novel method of forming a titanium silicide film having a small thickness underlying a boron phosphoric silicate glass film involved in semiconductor integrated circuits is provided.

With reference to FIG. 1A, a gate oxide film 2 and a field oxide film 2 are selectively formed on a semiconductor substrate 1 by a local oxidation of silicon method. A polysilicon film 4 having a thickness of 200 nanometers is deposited on an entire surface of the field oxide film 2 and the gate oxide film 3. The deposited polysilicon film 4 is subjected to a patterning by use of photo lithography and a reactive etching to form a gate electrode. A side wall oxide film not illustrated is formed at opposite sides of the gate electrode of the patterned polysilicon film 4 after which an ion-implantation into a substrate is carried out to form source and drain diffusion regions. A titanium layer having a thickness of for example 45 nanometers is deposited on an entire surface of the polysilicon film 4 for subsequent heat treatment at a temperature of 670° C. for 30 seconds to cause a reaction between titanium atoms in the titanium layer and silicon atoms in the polysilicon film to thereby form a titanium silicide film 5 having a thickness of 40 nanometers. Non reacted titanium atoms are removed by a solution of hydrogen peroxide and ammonia to leave only the titanium silicide film 5 on the polysilicon film 4. Then, the titanium silicide film 5 is subjected to a heat treatment at a temperature of 850° C. for 10 seconds to cause a crystallization of the titanium silicide film thereby a sheet resistance of the titanium silicide film is reduced.

Figure 2B:
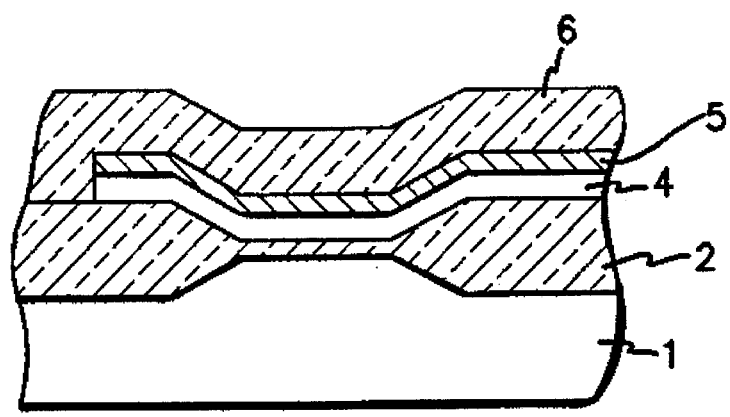

With reference to FIG. 2B, a boron phosphoric silicate glass film 6 having a thickness of 0.6 micrometers is by a vapor phase growth on an entire surface of the titanium silicide film 5. The vapor phase deposition of the boron phosphoric silicate glass film is carried out at a temperature of 400° C. This temperature provides no cohesion reaction of the titanium silicide film nor fineness reaction of the boron phosphoric silicate glass film thereby resulting in a low gettering of the born phosphoric silicate glass film. The boron phosphoric silicate glass shows a low gettering function to alkyl ions such as a sodium ion. Namely, some amount of the impurities still remain in the boron phosphoric silicate glass film. This results in a lowering of a reliability of the fabricated semiconductor integrated circuits. Subsequently, a heat treatment of the boron phosphoric silicate glass film at a temperature of 850° C. for 40 seconds is carried out by a halogen lamp anneal to cause a fineness reaction of the boron phosphoric silicate glass film 6 but to suppress any cohesion reaction of the titanium silicide film as appreciated from FIG. 1.

Figure 2C:
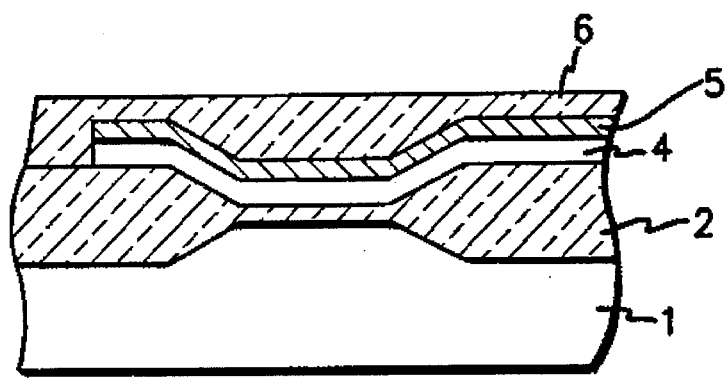

With reference to FIG. 2C the boron phosphoric silicate glass film 6 is subjected to a polishing to thereby obtain a planarization of the surface of the boron phosphoric silicate glass film 6. The boron phosphoric silicate glass film may serve as an inter-layer insulator. After that, contact holes and interconnections are formed as required.

As described above, the present invention utilizes the time difference between the cohesion reaction of the titanium silicaide film and the fineness of the boron phosphoric silicate glass film. The time difference between the both reactions is caused in that the cohesion reaction of the titanium silicaide film comprises a movement of substances constituting the titanium silicide film, while the fineness reaction of the boron phosphoric silicate glass comprises a variation of the atomic bonding of the boron phosphoric silicate glass without movement of the substances thereof.

As modifications of the present invention, the heat treatments at various temperatures are carried out to the titanium silicide film having a thickness of 80 nanometers. A heat treatment at a temperature of 950° C. or less may provide the above time difference between the cohesion reaction and the fineness reaction. By contrast, a heat treatment at a low temperature less than 650° C. results in an incomplete fineness reaction of the boron phosphoric silicate glass film.

In place of the polishing process, it is available to apply silicon on the boron phosphoric silicate glass film for subsequent etch-back process to obtain the planarization. It is also available that the heat treatment to cause the fineness reaction of the boron phosphoric silicate glass film but suppress the cohesion reaction of the titanium silicide film is carried out after the planarization process of the boron phosphorus silicate glass film and the formation of the contact holes as well as after the ion-implantation to form the diffusion regions. In place of the boron phosphoric silicate glass film, a phosphoric silicate glass film is available.

In the above embodiment the titanium layer is formed by a formation of the titanium layer on the polysilicon film for subsequent heat treatment to cause the atomic reaction between titanium in the titanium layer and silicon in the polysilicon layer to thereby form the titanium silicide film. However, it is also available that a titanium layer is deposited by a sputtering method on an insulation film. In this case, the heat treatment after the formation of the boron phosphoric silicate glass film is carried out at a temperature in the range from 650° C. to 950° C. for a time less than 70 seconds to cause the fineness reaction of the boron phosphoric silicate glass film but suppress the cohesion reaction of the titanium silicide film thereby making a thin titanium silicide film free from any disconnection thereof. This may permit an improvement of the density of the integration of the semiconductor integrated circuits.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims any modification of the present invention which fall within the spirit and scope of the invention.

What is claimed is:

1. A method of forming a silicate glass film including phosphorus on a titanium silicide film comprising the steps of:

forming a silicate glass film including phosphorus on a titanium silicide film; and subjecting said silicate glass film to a heat treatment at a temperature in the range from 650° C. to 950° C. for a time in the range from 20 to 70 seconds to cause a fineness reaction of said silicate glass film and suppress a cohesion reaction of said titanium silicide film.

2. The method as claimed in claim 1, wherein said titanium silicide film has a thickness less than 80 nanometers.

3. The method as claimed in claim 1, wherein said heat treatment is carried out at a temperature of 850° C. for 40 seconds.

4. The method as claimed in claim 3, wherein said titanium silicide film has a thickness less than 40 nanometers.

5. The method as claimed in claim 3, wherein said titanium silicide film has a thickness less than 20 nanometers.

6. The method as claimed in claim 1, wherein said silicate glass film comprises a boron phosphoric silicate glass film.

7. The method as claimed in claim 1, wherein said silicate glass film comprises a phosphoric silicate glass film.

8. The method as claimed in claim 1, further comprising the step of planarizing a surface of the silicate glass film after said heat treatment.

9. The method as claimed in claim 8, wherein said planarizing step comprises a polishing of said surface of said silicate glass film.

10. The method as claimed in claim 8, wherein said planarizing step comprises a application of silicon on said surface of said silicate glass film and subsequent etch-back thereof.

11. The method as claimed in claim 1, further comprising the step of planarizing a surface of the silicate glass film before said heat treatment.

12. The method as claimed in claim 11, wherein said planarizing step comprises a polishing of said surface of said silicate glass film.

13. The method as claimed in claim 11, wherein said planarizing step comprises a application of silicon on said surface of said silicate glass film and subsequent etch-back thereof.

14. The method as claimed in claim 1, wherein said heat treatment is carried out by use of a halogen lamp.

15. The method as claimed in claim 1, wherein said titanium silicide film is formed by a sputtering on titanium silicide.

16. The method as claimed in claim 1, wherein said titanium silicide film is formed by a deposition of a titanium film on a film including silicon and subsequent heat treatment to cause an atomic reaction between silicon atoms and titanium atoms to thereby form a titanium silicide film.

17. A method of forming a silicate glass film including phosphorus on a titanium silicide film involved in semiconductor integrated circuits, said method comprising the steps of:

forming a titanium silicide film on an insulation film;

forming a silicate glass film including phosphorus on a titanium silicide film;

subjecting said silicate glass film to a heat treatment at a temperature in the range from 650° C. to 950° C. for a time in the range from 20 to 70 seconds to cause a fineness reaction of said silicate glass film and suppress a cohesion reaction of said titanium silicide film; and planarizing a surface of said silicate glass film.

18. The method as claimed in claim 17, wherein said titanium silicide film has a thickness less than 80 nanometers.

19. The method as claimed in claim 17, wherein said heat treatment is carried out at a temperature of 850° C. for 40 seconds.

20. The method as claimed in claim 19, wherein said titanium silicide film has a thickness less than 40 nanometers.

21. The method as claimed in claim 19, wherein said titanium silicide film has a thickness less than 20 nanometers.

22. The method as claimed in claim 17, wherein said silicate glass film comprises a boron phosphoric silicate glass film.

23. The method as claimed in claim 17, wherein said silicate glass film comprises a phosphoric silicate glass film.

24. The method as claimed in claim 23, wherein said planarizing step comprises a polishing of said surface of said silicate glass film.

25. The method as claimed in claim 23, wherein said planarizing step comprises a application of silicon on said surface of said silicate glass film and subsequent etch-back thereof.

26. The method as claimed in claim 17, further comprising the step of planarizing a surface of the silicate glass film before said heat treatment.

27. The method as claimed in claim 26, wherein said planarizing step comprises a polishing of said surface of said silicate glass film.

28. The method as claimed in claim 26, wherein said planarizing step comprises a application of silicon on said surface of said silicate glass film and subsequent etch-back thereof.

29. The method as claimed in claim 17, wherein said heat treatment is carried out by use of a halogen lamp.

30. The method as claimed in claim 17, wherein said titanium silicide film is formed by a sputtering on titanium silicide.

31. The method as claimed in claim 17, wherein said titanium silicide film is formed by a deposition of a titanium film on a film including silicon and subsequent heat treatment to cause an atomic reaction between silicon atoms and titanium atoms to thereby form a titanium silicide film.

* * * * *